(12) United States Patent
Richter et al.

(10) Patent No.: US 8,563,380 B2
(45) Date of Patent: Oct. 22, 2013

(54) ELECTRIC NANODEVICE AND METHOD OF MANUFACTURING SAME

(76) Inventors: Shachar Richter, Mazkeret Batia (IL); Elad Mentovich, Haifa (IL); Itshak Kalifa, Bat-Yam (IL)

(*) Notice: Subject to any disclaimer, the term of this patent is extended or adjusted under 35 U.S.C. 154(b) by 136 days.

(21) Appl. No.: 12/811,710

(22) PCT Filed: Jan. 7, 2009

(86) PCT No.: PCT/IL2009/000024
§ 371 (c)(1),
(2), (4) Date: Jul. 6, 2010

(87) PCT Pub. No.: WO2009/087623
PCT Pub. Date: Jul. 16, 2009

(65) Prior Publication Data
US 2010/0276669 A1    Nov. 4, 2010

Related U.S. Application Data

(60) Provisional application No. 61/006,319, filed on Jan. 7, 2008.

(51) Int. Cl.
*H01L 21/336* (2006.01)

(52) U.S. Cl.
USPC ............................... 438/270; 257/E21.41

(58) Field of Classification Search
USPC .................. 438/268, 270; 257/E21.41
See application file for complete search history.

(56) References Cited

U.S. PATENT DOCUMENTS

| | | | |
|---|---|---|---|
| 6,674,099 B1 | 1/2004 | Augusto | |
| 6,972,467 B2 * | 12/2005 | Zhang et al. | 257/401 |
| 7,141,727 B1 * | 11/2006 | Appenzeller et al. | 257/20 |
| 7,170,120 B2 * | 1/2007 | Datta et al. | 257/288 |
| 7,217,976 B2 * | 5/2007 | Spring | 257/341 |
| 2001/0030350 A1 * | 10/2001 | Oowaki et al. | 257/410 |
| 2002/0171125 A1 | 11/2002 | Bao et al. | |
| 2004/0238814 A1 | 12/2004 | Mizusaki et al. | |
| 2006/0125025 A1 | 6/2006 | Kawashima et al. | |
| 2006/0192231 A1 | 8/2006 | Nihei | |
| 2007/0246784 A1 * | 10/2007 | Kang et al. | 257/407 |

FOREIGN PATENT DOCUMENTS

WO    WO 2009/087623    7/2009

OTHER PUBLICATIONS

Lin et al., "Ambipolar-to-Unipolar Conversion of Carbon Nanotube Transistors by Gate Structure Engineering", 2004, Nano Letters, American Chemical Society, vol. 4, pp. 947-950.*

International Preliminary Report on Patentability Dated Jul. 22, 2010 From the International Bureau of WIPO Re. Application No. PCT/IL2009/000024.

Bhuwalka et al. "Scaling the Vertical Tunnel FET With Tunnel Bandgap Modulation and Gate Workfunction Engineering", IEEE Transactions on Electron Devices, 52(5): 909-917, 2005.

Sun et al. "The Effects of Oxygen Exposure on the Electrical Conductance characteristics of High Frequency Oxygen Plasma Anodized Al Films", Perganion vol. 48 (11), p. 953-956, 1997.

(Continued)

*Primary Examiner* — William D Coleman

(57) ABSTRACT

A nanodevice is disclosed. The nanodevice comprises: a drain region, a source region opposite to the drain region and being separated therefrom at least with a trench, and a gate region, isolated from the drain and the source regions and from the trench. The trench has a height which is between 1 nm and 30 nm.

13 Claims, 15 Drawing Sheets

(56) References Cited

OTHER PUBLICATIONS

International Search Report Dated Apr. 28, 2009 From the International Searching Authority Re.: Application No. PCT/IL2009/000024.
Written Opinion Dated Apr. 28, 2009 From the International Searching Authority Re.: Application No. PCT/IL2009/000024.
DiBenedetto et al. "High-Capacitance Organic Nanodielectrics: Effective Medium Models of Their Response", J. Phys. Chem. B vol. 110, p. 22394-22399, 2006.
Fried et al. "Ordered Two-Dimensional Arrays of Ferrite Nanoparticales", Advanced Materials vol. 13 (15), 2001.
Fujimoto et al. "High-Performance, Vertical-Type Organic Transistors with Built-In Nanotriode Arrays", Advanced Materials, 19: 525-530, 2007.
Ghosh et al. "Gating of a Molecular Transistor: Electrostatic and Conformational",Nano Letters, vol. 4 (4), p. 565-568, 2004.
Paltiel et al. "Self-Assembling of InAs Nanocrystala on GaAs: The Effect of Electronic Coupling and Embedded Gold Nanoparticles on the Photoluminescence", Applied Physics Letters vol. 89, 2006.
Peng "Modifications of Carbon Nanotubes With Polymers", European Polymer Journal vol. 41, p. 2693- 2703, 2005.
Sun et al. "The Effects of Oxygen Exposure on the Electrical Conductance characteristics of High Frequency Oxygen Plasma Anodized AI Films", Pergamon vol. 48 (11), p. 953-956, 1997.
Tinoco et al. "Room Temperature Plasma Oxidation Mechanism to Obtain Ultrathin Silicon Oxide and Titanium Oxide Layers", Microelectronics Reliability, 43: 895-903, 2003.
Williams et al. "Etch Rates for Micromachining Processing—Part II", Journal of Microelectromechanical Systems, 12(6): 761-778, 2003.
Yamane et al. "Ainbipolar Organic Light Emitting Field Effect Transistors With Modified Asymmetric Electrodes", Applied Physics Letters, XP012094215, 90(16): 162108-1-162108-3, Apr. 18, 2007.

\* cited by examiner

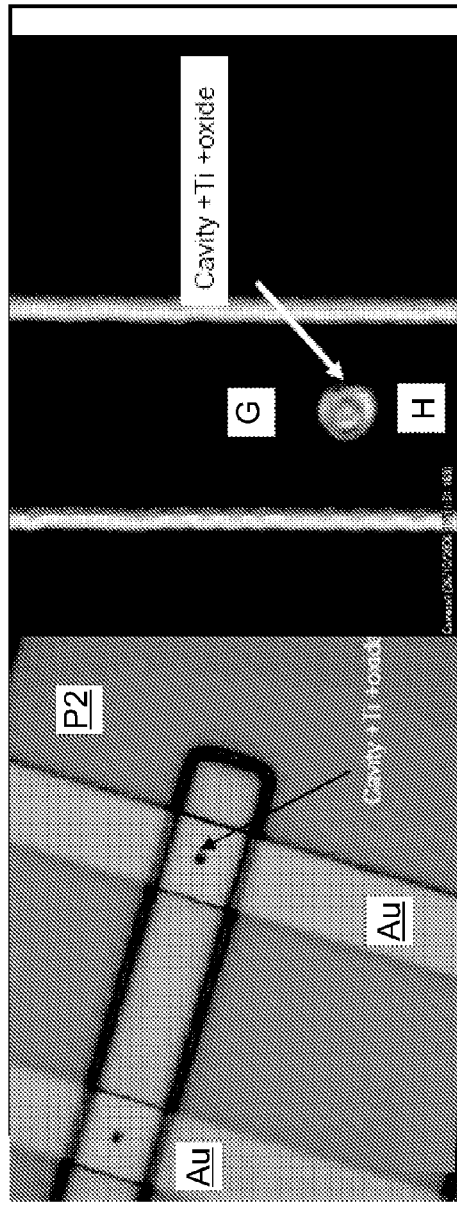
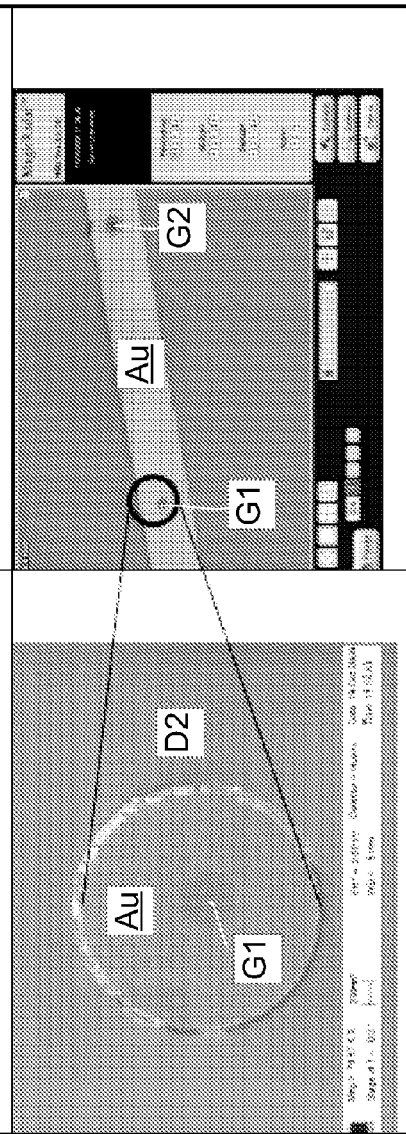
FIG. 5A  FIG. 5B  FIG. 5C  FIG. 5D

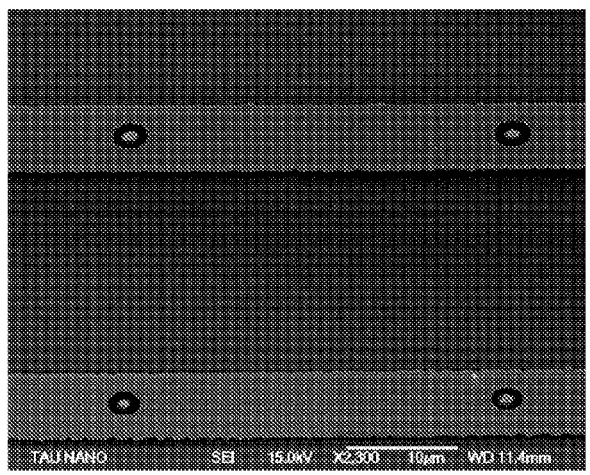
FIG. 6G
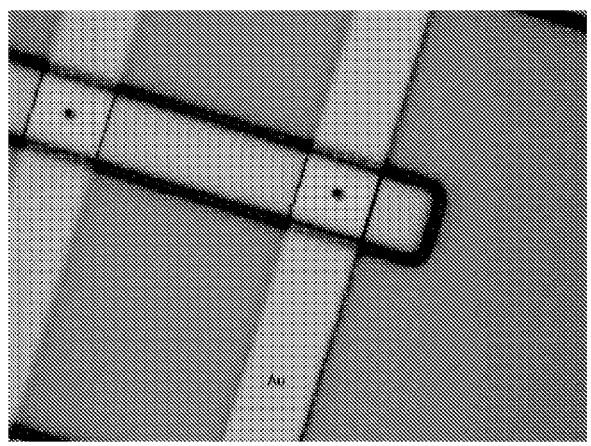
FIG. 6H
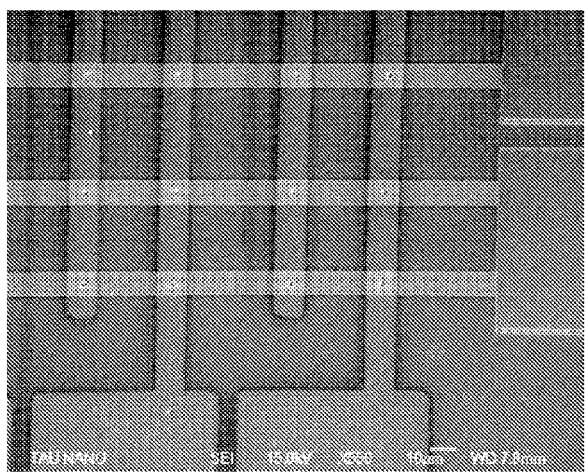
FIG. 6-I

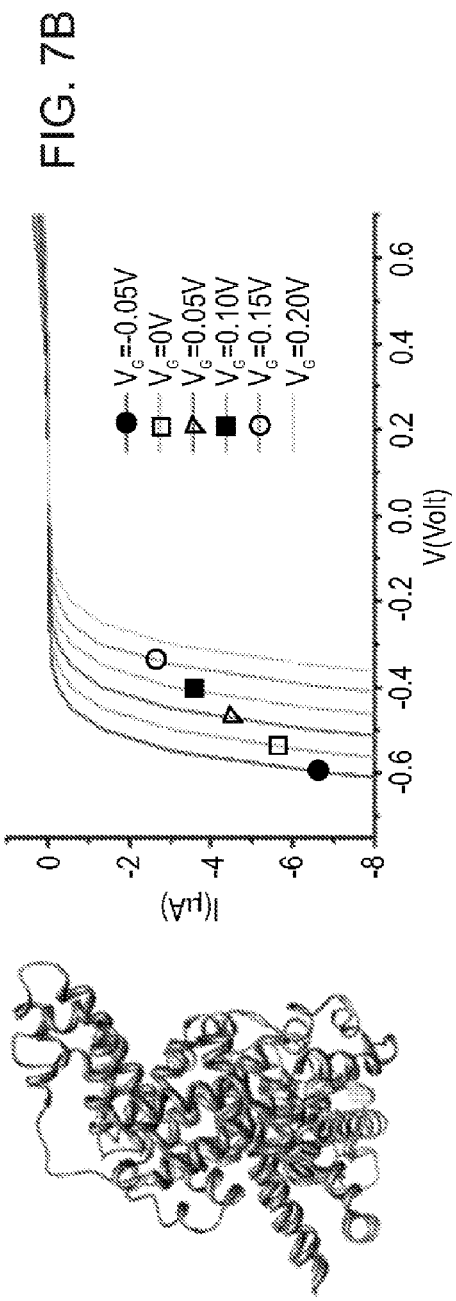
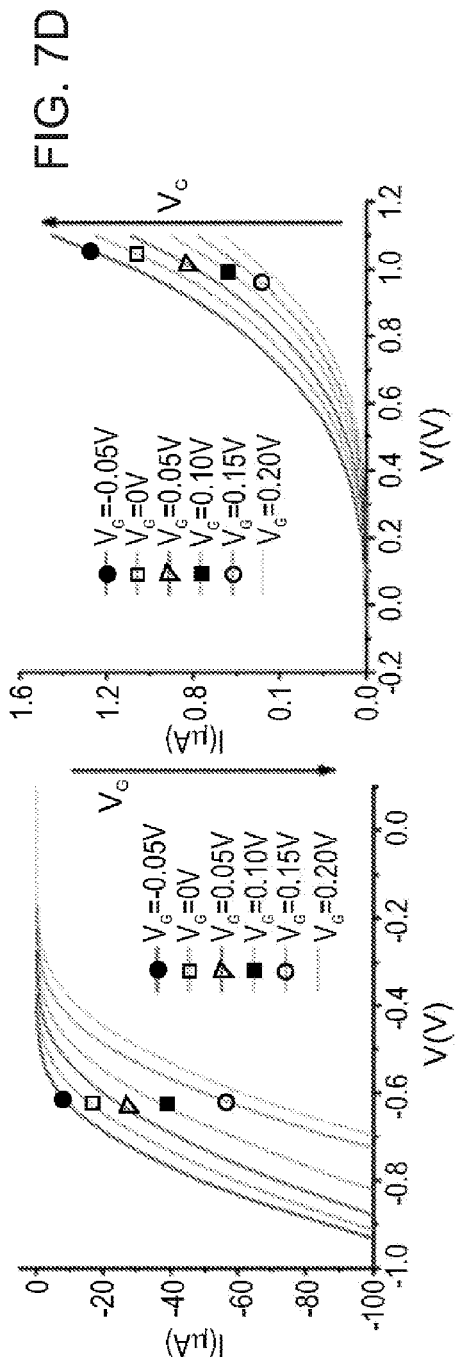
FIG. 7A
FIG. 7B
FIG. 7C
FIG. 7D

ELECTRIC NANODEVICE AND METHOD OF MANUFACTURING SAME

RELATED APPLICATIONS

This Application is a National Phase of PCT Patent Application No. PCT/IL2009/000024 having International filing date of Jan. 7, 2009, which claims the benefit of U.S. Provisional Patent Application No. 61/006,319 filed on Jan. 7, 2008. The contents of the above Applications are all incorporated herein by reference.

FIELD AND BACKGROUND OF THE INVENTION

The present invention, in some embodiments thereof, relates to an electric nanodevice and its fabrication and, more particularly, but not exclusively, to a vertical transistor device having a nanometric channel.

Integrated circuits, such as ultra-large-scale integrated circuits, can include as many as one million transistors or more. The circuit can include complementary metal oxide semiconductor (CMOS) field effect transistors (FETs), each including semiconductor gates adjacent a channel region and between drain and source regions. The drain and source regions are typically heavily doped with a p-type or an n-type dopant.

Generally, conventional integrated circuits have employed lateral transistors or devices. Lateral transistors include source and drain regions disposed below a top surface of a bulk or semiconductor-on-insulator (SOI) substrate and a gate disposed above the top surface. Thus, the source region, drain region, and gate of lateral transistors each consumes valuable space on the top surface of the substrate. The gate is disposed on only one side of a channel between the source and the drain. Accordingly, the conventional lateral device can have a limited drive current.

As demands for integration (transistor density) increase, vertical transistors have been considered. Vertical transistors can be insulated gate field effect transistors (IGFETs), such as, MOSFETS. In a conventional vertical MOSFET, source and drain regions are provided on opposite surfaces (e.g., a top surface and a bottom surface) of a semiconductor layer and a body region is disposed between the source and drain regions. During MOSFET operation, current flows vertically between the source and drain regions through a channel within the body region. The channel is often described in terms of its length, which is commonly defined as the spacing between the source and drain regions at the semiconductor surface, and its width, which is commonly defined as the dimension perpendicular to the length. In vertical transistors, the channel width is typically far greater than channel length.

Numerous techniques have been developed for the fabrication of semiconductor vertical transistors. Representative examples include Stutzmann, et al., Science 2003, 299, 1881-1884; Schmidt et al., Small 2006, 2, 85-88; Lee et al., Nano Lett 2003, 3, 113-117; Kagan et al., Nano Letters 2003 Vol. 3 No. 2 pp 119-124; and Maruccio et al. Adv Mater 2005, 17, 816.822.

Additional background art includes U.S. Pat. Nos. 6,180,956, 6,855,977; U.S. Published Application Nos. 20020175390, 20050032203, 20050040417, 20050151261, 20050189536, 20070102699, 20070145371, 20070181871, 20070210313; and International Patent Publication Nos. WO/03052835 and WO/07004803.

SUMMARY OF THE INVENTION

According to an aspect of some embodiments of the present invention there is provided an electric nanodevice. The nanodevice comprises: a drain region, a source region opposite to the drain region and being separated therefrom at least with a trench, and a gate region, isolated from the drain and the source regions and from the trench, wherein the trench has a height of between 1 nm and 30 nm.

According to some embodiments of the invention the trench comprises at least one of: a self assembled monolayer, a spin coated material, an inorganic nanocrystal, a polycrystalline crystal, a conjugated polymer, and a Langmuir Blodgett film.

According to some embodiments of the invention a single isolation layer isolates the gate region from the source region and from the trench.

According to some embodiments of the invention the isolation layer comprises at least one of: an oxide layer, a nitride layer and a high dielectric polymer.

According to some embodiments of the invention the gate region comprises two conductive substances, each in electrical contact with the other.

According to some embodiments of the invention the gate region is perpendicular to the source and drain, wherein the gate region extends at least from the source to the drain through the trench.

According to some embodiments of the invention the nanodevice further comprises a base substrate, contacting the gate region and constituted to allow back gating of the nanodevice via the base substrate.

According to some embodiments of the invention the nanodevice is a vertical transistor.

According to some embodiments of the invention the device is phototransistor.

According to an aspect of some embodiments of the present invention there is provided an electronic circuitry. The circuitry comprises a substrate having thereon a plurality of nanodevices, wherein at least one of the nanodevices is the nanodevice described above.

According to an aspect of some embodiments of the present invention there is provided a sensor device. The sensor device comprises the nanodevice described above.

According to an aspect of some embodiments of the present invention there is provided a fast logic device. The fast logic device comprises the nanodevice described above.

According to an aspect of some embodiments of the present invention there is provided an electro-optic device. The electro-optic device comprises the nanodevice described above.

According to an aspect of some embodiments of the present invention there is provided a memory device. The memory device comprises the nanodevice described above.

According to some embodiments of the invention the trench has a height of between 1 nm and 15 nm.

According to some embodiments of the invention the height of the trench is below 2 nm.

According to some embodiments of the invention the height gate region is larger than 70% of the height of the trench.

According to some embodiments of the invention the nanodevice is characterized by an operating voltage which is below 5 volts or below 3 volts or below 2, e.g., about 1 volt or less.

According to some embodiments of the invention the nanodevice is characterized by leakage currents which are at least 10 times lower than a drain-source current for any gate voltage below 0.5 volts. According to some embodiments of the invention the nanodevice is characterized by leakage currents which are at least 50 times lower than a drain-source current for any gate voltage below 0.5 volts. According to some embodiments of the invention the nanodevice is characterized by leakage currents which are about 100 times lower than a drain-source current for any gate voltage below 0.5 volts.

According to some embodiments of the invention the nanodevice is characterized by leakage currents which are at least 100 times lower than a drain-source current for at least one gate voltage below 0.5 volts. According to some embodiments of the invention the nanodevice is characterized by leakage currents which are at least 500 times lower than a drain-source current for at least one gate voltage below 0.5 volts. According to some embodiments of the invention the nanodevice is characterized by leakage currents which are about 1000 times lower than a drain-source current for at least one gate voltage below 0.5 volts.

According to some embodiments of the invention the nanodevice is ambipolar.

According to an aspect of some embodiments of the present invention there is provided a method of fabricating a nanodevice. The method comprises: forming a cavity in a layered structure having a first conductor layer interposed between a base substrate and a dielectric layer, such that the cavity extends over at least the conductor layer and the dielectric layer. The method further comprises depositing a metallic pillar into the cavity, exposing a region of the conductor layer near the pillar thereby widening the cavity at the dielectric layer, depositing a channel layer in the exposed region, and depositing a second conductor layer on the channel layer.

According to some embodiments of the invention the method comprises partially widening the cavity at the first conductor layer, prior to the depositing of the pillar.

According to some embodiments of the invention the method comprises oxidizing the pillar prior to the exposure of the region of the conductor layer.

According to some embodiments of the invention the cavity is formed to extend from the base substrate through the first conductor layer to the dielectric layer, such that when the pillar is deposited, electrical contact is establish between the pillar and the base substrate, thereby allowing back gating of the nanodevice via the base substrate.

According to some embodiments of the invention the method is executed for forming a vertical transistor, wherein the first conductor layer is a source electrode of the transistor, the second conductor layer is a drain electrode of the transistor, and the pillar is a gate electrode of said transistor.

According to an aspect of some embodiments of the present invention there is provided a method which comprises: forming a cavity in a layered structure having a first conductor layer interposed between a base substrate and a dielectric layer, such that the cavity extends over at least the conductor layer and the dielectric layer. The method further comprises partially widening the cavity at the first conductor layer to form a niche therein, depositing a metallic pillar into the cavity without filling the niche, exposing a region of the conductor layer near the pillar thereby widening the cavity at the dielectric layer, and oxidizing the pillar.

According to some embodiments of the invention the method the cavity is widened by no more than 10 nm. According to some embodiments of the invention the method the cavity is widened by no more than 5 nm. According to some embodiments of the invention the method the cavity is widened by about 2 nm.

According to some embodiments of the invention the method the cavity is widened at a rate of about 10 nm per minute.

According to an aspect of some embodiments of the present invention there is provided a method of fabricating a nanodevice. The method comprises forming a cavity in a layered structure having a first conductor layer interposed between a base substrate and a dielectric layer, such that the cavity extends over at least the conductor layer and the dielectric layer. The method further comprises growing a nanostructure in the cavity, exposing a region of the conductor layer near the pillar thereby widening the cavity at the dielectric layer, and oxidizing the nanostructure. According to some embodiments of the invention the method further comprises widening the cavity at the dielectric layer and depositing a channel layer a region formed thereby.

According to some embodiments of the invention the nanostructure is a nanotube.

According to some embodiments of the invention the nanostructure is a nanowire.

According to some embodiments of the invention the cavity is formed to extend from the base substrate through the first conductor layer to the dielectric layer, such that when the nanostructure is grown, electrical contact is establish between the nanostructure and the base substrate, thereby allowing back gating of the nanodevice via the base substrate.

According to some embodiments of the invention the method is executed for forming a vertical transistor, wherein the first conductor layer is a source electrode of the transistor, the second conductor layer is a drain electrode of the transistor, and the nanostructure is a gate electrode of the transistor.

According to an aspect of some embodiments of the present invention the there is provided a vertical transistor which comprises the nanodevice described herein.

According to an aspect of some embodiments of the present invention the there is provided a phototransistor which comprises the nanodevice described herein.

According to an aspect of some embodiments of the present invention the there is provided a light emitting transistor which comprises the nanodevice described herein.

According to an aspect of some embodiments of the present invention the there is provided an electrical switch which comprises the nanodevice described herein.

According to an aspect of some embodiments of the present invention the there is provided a double gate transistor which comprises the nanodevice described herein.

According to an aspect of some embodiments of the present invention the there is provided a multilayer solid state device which comprises the nanodevice described herein, the multilayer solid state device can be a device with four or more active layers, such as a controlled rectifier or a trysistor.

According to an aspect of some embodiments of the present invention the there is provided a logic device which comprises the nanodevice described herein.

According to an aspect of some embodiments of the present invention the there is provided a electro-optic device which comprises the nanodevice described herein.

According to an aspect of some embodiments of the present invention the there is provided a magneto electronic device which comprises the nanodevice described herein.

According to an aspect of some embodiments of the present invention the there is provided a memory device which comprises the nanodevice described herein.

According to an aspect of some embodiments of the present invention the there is provided a display device which comprises the nanodevice described herein.

According to an aspect of some embodiments of the present invention the there is provided a sensor which comprises the nanodevice described herein. According to some embodiments of the present invention the sensor is an electrochemical sensor, according to some embodiments of the present invention the sensor is a biological sensor Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 5A-D are microscopic images of transistors in various stages of fabrication according to an embodiment of the invention;

FIGS. 6F-G are tilted HRSEM images of a single transistor (FIG. 6F) and an array of transistors (FIG. 6E) fabricated using the production procedure described in FIGS. 6A-E;

FIG. 6H is an optical image of fabricated using the production procedure described in FIGS. 6A-E, after the formation of the gate electrode;

FIG. 6-I is an HRSEM image showing an array of vertical transistors fabricated using the production procedure described in FIGS. 6A-E;

FIG. 7A shows an X-ray-crystallography-based structure of Bovine Serum Albumin (BSA);

FIGS. 7B-D show transfer characteristics at room temperature of a transistor fabricated using the production procedure described in FIGS. 6A-E;

Figure 1:
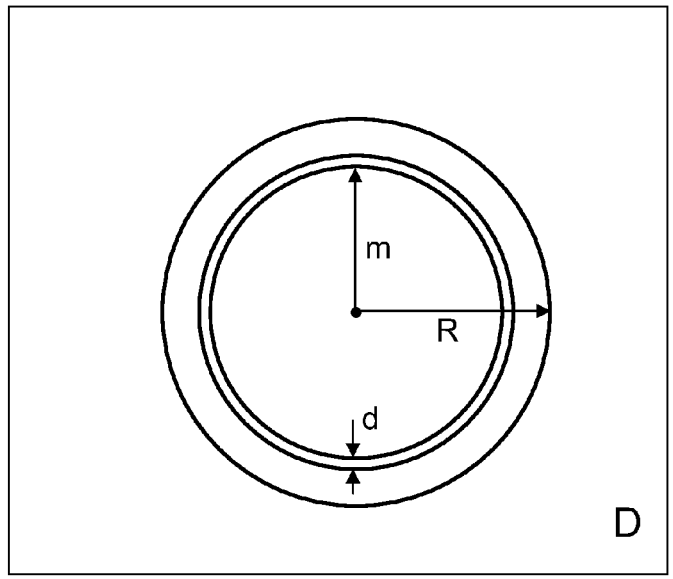
FIG. 1 is a schematic illustration of a top view of an electric nanodevice according to an embodiment of the invention, illustrating some typical dimensions.

DESCRIPTION OF SPECIFIC EMBODIMENTS
OF THE INVENTION

The present invention, in some embodiments thereof, relates to a an electric nanodevice and its fabrication and, more particularly, but not exclusively, to a vertical transistor device having a nanometric channel.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

It was realized by the present inventors that due to limitations in current technology, it is difficult to produce electric nanodevices which are sufficiently small suitable for constructing dense arrays or circuitries. The present inventors devised a technique for producing electric nanodevices, thereby overcoming obstacles existing in traditional techniques.

The electric nanodevice of the present embodiments can be used as a component in many applications, include, without limitation, a vertical transistor (e.g., static induction transistor), a phototransistor, a light emitting transistor, a double gate transistor, an electrical switch, a multilayer solid state device (particularly a device with four or more active layers, such as a controlled rectifier or a trysistor), a logic device, an electro-optic device, an magneto electronic device, a memory device, a display device (e.g., a flexible display device), a sensor (e.g., an electrochemical sensor, a biological sensor).

In an embodiment of the invention, the nanodevice has a very short length, preferably below 10 nm, more preferably below 5 nm, more preferably below 4 nm, e.g., 2 nm, between the source, drain and gate electrodes.

In some embodiments of the present invention the nanodevice is ambipolar.

"Ambipolar nanodevice," at used herein refers to a nanodevice having both n-type and p-type properties, depending on the gate voltages.

The embodiments in which the nanodevice is ambipolar are particularly useful for the fabrication of complementary circuitries (having both n-type and p-type devices on the same wafer), since it significantly reduces the number of manufacturing steps of the circuitry.

An embodiment of the invention relates to a vertical molecular transistor that can be fabricated, for example, using VLSI compatible processes with a nanometric sized trench length. In various exemplary embodiments of the invention the trench height of the vertical transistor is from about 1 nm to about 30 nm, more preferably from about 1 nm to about 15 nm, from about 1 nm to about 10 nm, from about 1 nm to about 5 nm, e.g., about 1 nm or about 2 nm. In accordance with this embodiment, vertical molecular transistor operates in frequencies approaching the THz (=$10^{12}$ Hz) range.

In various exemplary embodiments of the invention the vertical transistor is based on a side-gate architecture.

The fabrication process of the nanodevice can utilize conventional photolithography or deep UV photolithography techniques. In some embodiments of the present invention the fabrication process of the nanodevice can utilize conventional photolithography and can allow simultaneous fabrication of a plurality of such devices. For example, a circuitry of at least 1,000, more preferably at least 5,000, more preferably at least about 10,000 nanodevices can be fabricated in a single batch. In some embodiments, at least $10^{13}$ nanodevices are loaded on a 3" wafer. In various exemplary embodiments of the invention at least a few of the nanodevices on the wafer are n-type nanodevices, and at least a few of the nanodevices on the wafer are p-type nanodevices.

The nanodevice of the present embodiments can be transparent or semi transparent depending on the light transparency of the substances composing the device. When the device is transparent, it can be used as a phototransistor, or, using a light source, function as a gate electrode to obtain double gate transistor.

In some embodiments of the present invention the source-drain transport curves of the nanodevice do not show saturation current at a certain voltage. This is unlike traditional MOSFET in which once the source-drain current reaches its maximum value, it maintains that value even when the drain-source is increased. It is postulated by the present inventors that the lack of saturation current in the device of the present embodiment is at least partially due to the short length of the channel.

In some embodiments of the present invention the nanodevice exhibits high sensitivity to the gate voltage. For example, a change of about 50 mV in the gate voltage results in a change of 5 folds in the current at room temperature, and a change of about 15 mV in the gate voltage results in a change of 5 folds in the current at about 77 K. This sensitivity is considerably higher than the sensitivity of conventional planar transistors.

In some embodiments of the present invention the operating voltage of the nanodevice is below 5 volts, more preferably below 2 volts, more preferably below 1 volts. In these embodiments, the channel of the device is preferably, but not necessarily organic. Such low operating voltage outperforms many conventional organic transistors. These embodiments are particularly useful when it is desired to incorporate the device in a low-power-circuit application, such as, but not limited to, a battery operated device, a consumable sensor, a plastic electronics device, etc.

The nanodevice of the present embodiments preferably has low leakage currents. In various exemplary embodiments of the invention the leakage currents are sufficiently low for allowing the nanodevice to function in a similar way to a field effect transistor. Yet, in some embodiments, although the function is similar to a field effect transistor, the operation mechanism is not the same as in field effect transistor, particularly, but not exclusively, in embodiments in which the channel is a monolayer of molecules.

For any gate voltage which is below 0.5 volt, the gate-source and/or gate-drain leakage current of the device of the present embodiments are preferably at least 10 times or at least 50 times lower than the drain-source current. For at least one gate voltage which is below 0.5 or below 0.4 volts, the gate-source and/or gate-drain leakage current of the device of the present embodiments are preferably at least 10 times or at least 50 times or at least 100 times or at least 500 times, or at least 1000 times lower, e.g., 5000 times lower than the drain-source current.

The nanodevice of the present embodiments can be incorporated in various applications, particularly applications is which vertical transistors are employed. Representative examples include, without limitations, fast logic devices, electro-optic devices, electromagnetic devices and memory devices.

Referring now to the drawings, FIG. 1 illustrates a top view of a nanodevice 10, according to an embodiment of the present invention. Device 10 can be a vertical transistor. FIG. 1 illustrates a gate electrode having a radius m, coated at the outside thereof with a thin gate-oxide layer, of thickness d. The gate electrode and its oxide layer are within a cavity of radius R in a dielectric layer D.

In an embodiment of the invention, R is in the range of from about 1000 nm to about 2000 nm, optionally about 1000 nm; m is in the range of from about 700 nm to about 900 nm, optionally 800 nm, and d is in the range of from about 1 nm to about 5 nm. The area of the device is the area covering the angular surface separating the oxide layer from the dielectric layer. Thus, for example, when the gate and cavity are circular, the transistor area is $\pi(R^2-(m+d)^2)$. For example, when the dimensions of R, m, and d are 1000 nm, 800 nm, and 2 nm respectively, the area of device 10 is about $10^6$ nm$^2$ or 1 µm$^2$.

In an embodiment of the invention, R is in the range of from about 10 nm to about 25 nm, optionally about 20 nm; m is in the range of from about 5 nm to about 15 nm, optionally 10 nm, and d is in the range of from about 1 nm to about 5 nm, for example, 2 nm. In this arrangement, the transistor area is about 800 nm$^2$.

In an exemplary embodiment of the invention, the transistor trench length, L (not shown in the drawing, as it is perpendicular to the plane of the drawing), is determined by the thickness of a Self Assembled Monolayer (SAM) deposited at the cavity and bordered with the oxide layer. Additionally or alternatively, the oxide layer width d is determined by controlling the gate oxidation rate and duration.

Figure 2:
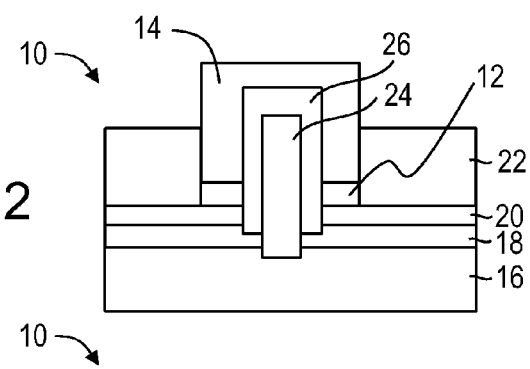
FIG. 2 is a schematic illustration of an electric nanodevice in embodiments in which a trench is protected from the environment
Figure 3A:
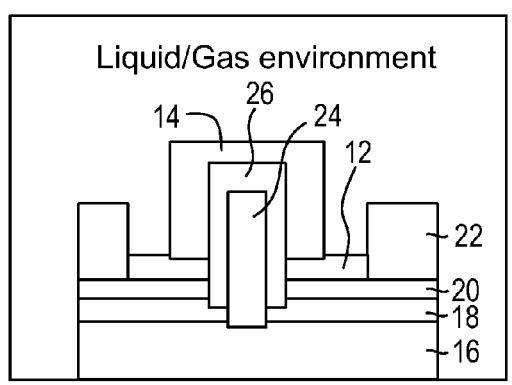
FIGS. 3A-B is a schematic illustration of an electric nanodevice in embodiments in which a trench is exposed to the surrounding environment.
Figure 3B:
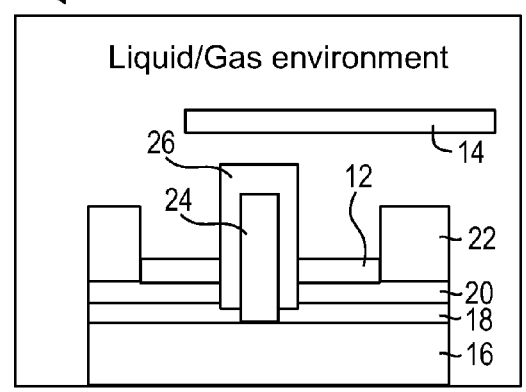

FIGS. 2 and 3A-B illustrate three optional configurations of device 10 according to some embodiments of the present invention.

FIG. 2 schematically illustrates a structure of an encapsulated device, in which a trench 12 is protected from the environment with an upper electrode 14. An encapsulated device can be useful, for instance, as a fast logic device, electro-optic device, electromagnetic device or memory device.

FIGS. 3A-B schematically illustrate embodiments in which trench 12 is exposed to the surrounding environment, for instance, to liquids or gases surrounding it. In these embodiments, the chemical and/or physical properties of the trench changes in response to changes in the surrounding environment. These embodiments are particularly useful when device 10 is used, for instance, as electrochemical or biological sensor.

Also shown in FIGS. 2 and 3A-B are a base substrate 16 which can be made of a conductive material or a doped semiconductor material, a first dielectric layer 18, a conductive layer 20 and a second dielectric layer 22. Trench 12 is located within a cavity in layer 22. Device 10 further comprises a vertical conductive pillar 24 (e.g., a metal pillar or a nanostructure such as a nanotube or nanowire) coated by a third dielectric layer 26, such as, but not limited to, native oxide layer, grown oxide layer, polymeric layer, layered protein assembly and the like. Device 10 can function as a transistor in which case layer 20 can serve as a source electrode, trench 12 can serve as a channel layer, layer 14 can serve as a drain electrode and pillar 24 can serve as a gate electrode. In various exemplary embodiments of the invention pillar 24 serves as a back gate, wherein the gate voltage is applied through base substrate 16.

The nanodevice of the present embodiments can be fabricated in more than one way.

In some embodiments of the present invention, a cavity is formed in a layered structure having a first conductor layer interposed between a base substrate and a dielectric layer, such that cavity extends over at least the conductor layer and the dielectric layer. The first conductor layer can be used, for example, as a source electrode. In various exemplary embodiments of the invention the cavity is partially widened at the first conductor layer. This widening forms a niche which can be filled with an oxide layer or other isolating layer, such as, but not limited to, nitride layer and dielectric polymer. Preferably, the isolating layer has a high dielectric coefficient, e.g., at least 10, more preferably at least 12. The partial widening is preferably executed so as to widen the cavity by no more than 10 nm or no more than 5 nm or no more than 2 nm.

Once the cavity is prepared, a metallic pillar is deposited into the cavity, preferably without filling the niche. Alternatively, a nanostructure such as, but not limited to, a nanotube or nanowire can be grown within, or deposited into, the cavity. In various exemplary embodiments of the invention the pillar or nanostructure is oxidized after its deposition to form an oxide layer. In various exemplary embodiments of the invention a region of the conductor layer near the pillar is exposed so as to widen the cavity at the dielectric layer, and a channel layer is deposited in the exposed region. Many types of channel layers are contemplated. Representative examples include, without limitation, a SAM (e.g., a protein-based SAM), a spin coated material, an inorganic nanocrystal, a polycrystalline crystal, a conjugated polymer, a Langmuir Blodgett film, and any combination thereof. Also contemplated is the use of vapor deposition for coating the base of the cavity with a channel material.

In various exemplary embodiments of the invention a second conductor layer is deposited thereon thus forming a channel sandwiched between a source electrode and a drain electrode. Representative examples for materials suitable for the first conductive layer (source electrode) include, without limitation, gold. Representative examples for materials suitable for the second conductive layer (drain electrode) include, without limitation, metals (e.g., palladium, gold), conductive polymers (e.g., derivatives of polyacetylene, polyaniline, or polypyrrole), indium tin oxide (ITO), electrically conductive doped tin oxide (e.g., fluorine-doped tin oxide) and the like.

Figure 4A:
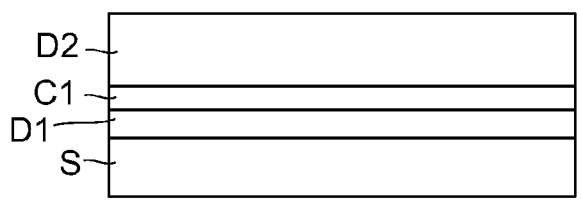
FIGS. 4A-N are schematic illustrations of a transistor in various stages of its fabrication according to an embodiment of the invention.
Figure 4B:
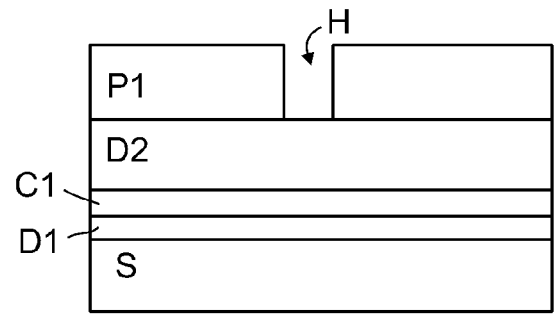
Figure 4C:
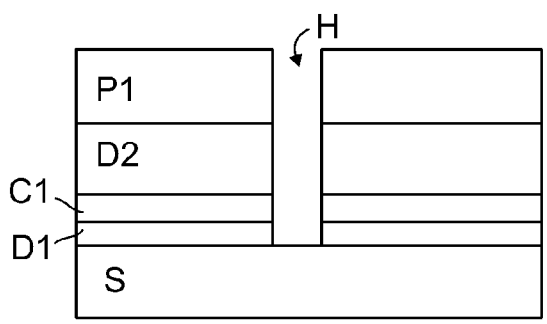
Figure 4D:
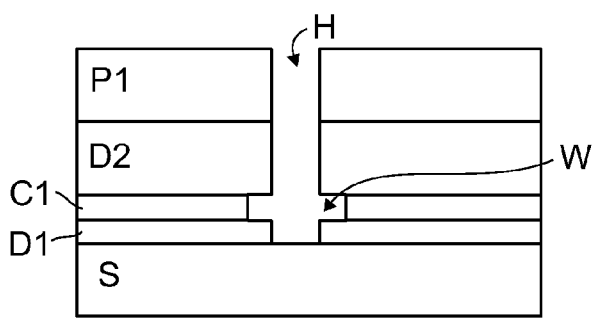
Figure 4E:
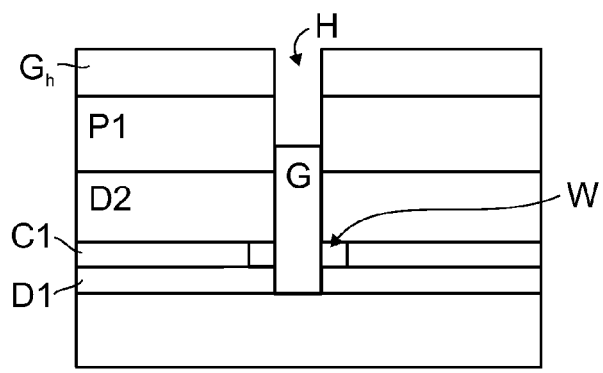
Figure 4F:
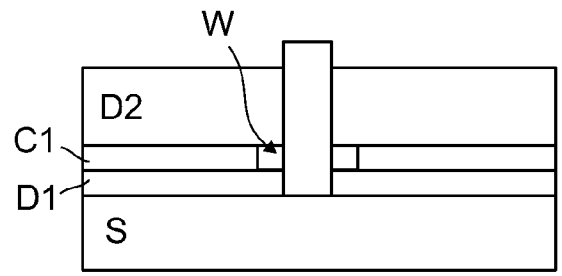
Figure 4G:
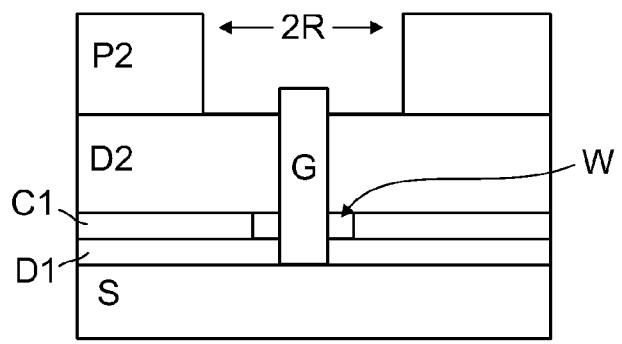
Figure 4H:
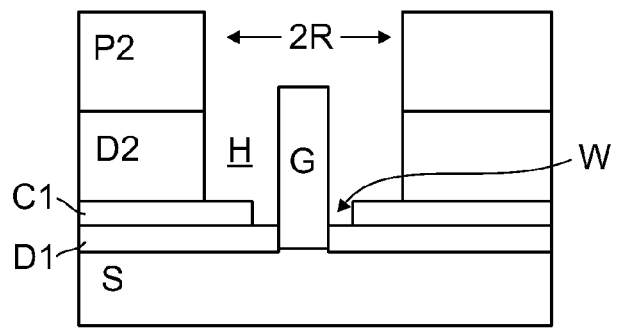
Figure 4I:
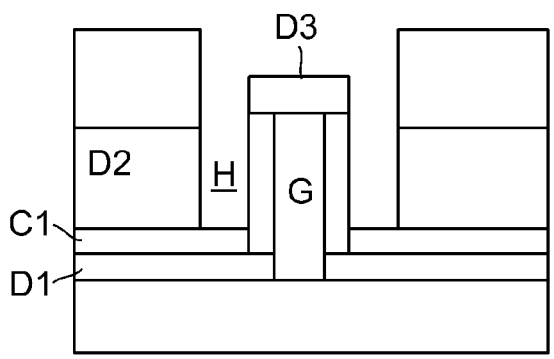
Figure 4J:
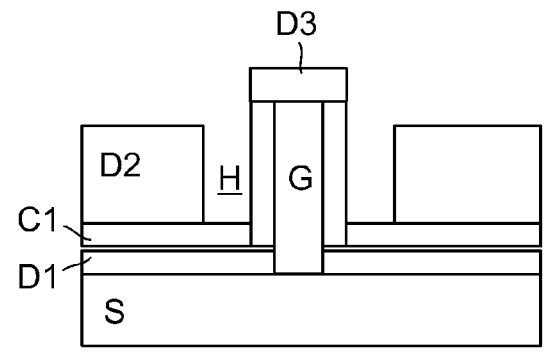
Figure 4K:
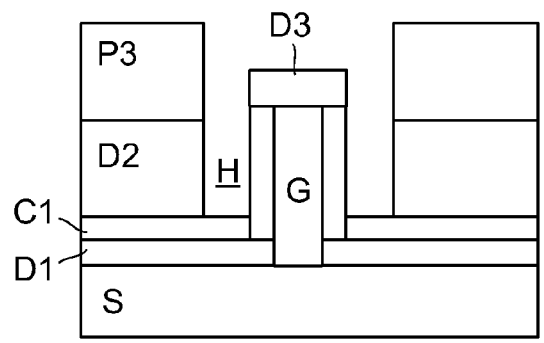
Figure 4L:
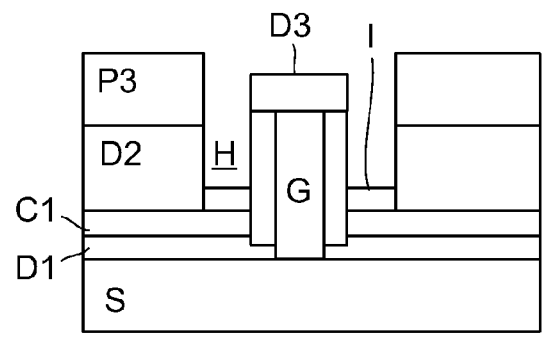
Figure 4M:
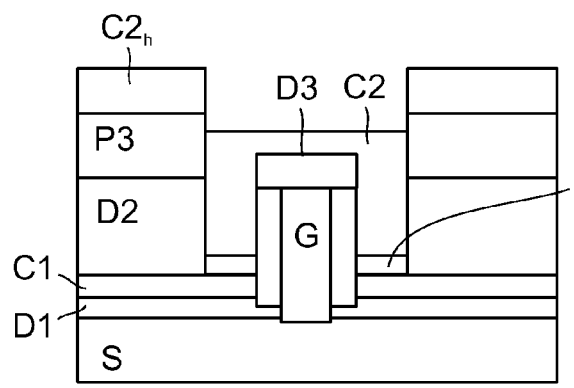
Figure 4N:
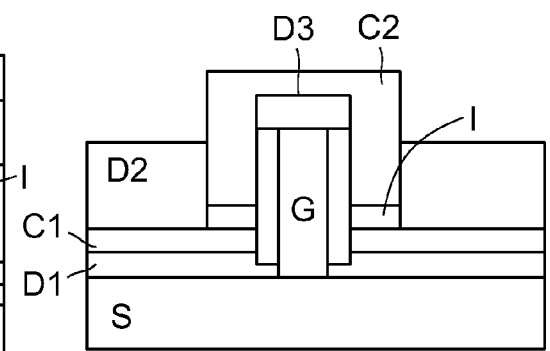

FIGS. 4A-N schematically illustrate a nanodevice in various fabrication stages, according to various exemplary embodiments of the present invention.

FIG. 4A shows a doped semiconductor substrate S, having on top a dielectric layer D1. These can be, for example, a doped layer in a commercially available silicon/silicon oxide wafer. Two layers are deposited on dielectric layer D1: a conductor layer C1, e.g., gold, and a second dielectric layer D2. The material of layer D2 can be the same as or different from the material of layer D1. Optionally, D2 is silicon nitride.

FIGS. 4B and 4C illustrate a definition of a cavity or hole H going through all the layers, from the upper dielectric D2 down to the upper surface of the semiconductor S. In FIG. 4B a photoresist P1 is shown deposited on the upper dielectric for defining the cavity H, and in FIG. 4C the structure is shown after etching. The etching is optionally dry etching, for instance, reactive ion etching (RIE) using SF6 as an etchant. Cavity H is formed for the purpose of filling it, at least partially, with a gate electrode which can be in the form of a conducting pillar, e.g., a titanium pillar. The width of cavity H is approximately 2m, where m is defined in the context of FIG. 1.

FIG. 4D shows the structure after conducting layer C1 is wet-etched to create widen cavity H at layer C1. The wet etching creates a sub-cavity W at layer C1 that is from about 2 nm to about 5 nm wide. This etching is optionally carried out with a standard selective etchant (for instance, where the conductor is gold, the gold etchant 651818 is a suitable etchant). To control the etching to stop already after a few nm, the standard etchant is preferably diluted, e.g., 10 times in water, to have slower etching. With such a diluted etchant, a sub-cavity of about 5 nm in width is formed within about 20 seconds.

FIGS. 4E and 4F show the structure after a gate pillar G, for example, a titanium pillar, is built in cavity H. Optionally, the pillar is built by evaporation. Optionally, during the evaporation, the structure is kept at a temperature of about 77K to prevent overheating of photoresist P1. The gate material which horizontally covers photoresist P1 during the evaporation process is shown at $G_h$. A lift off technique is preferably employed to remove photoresist P1 together with the horizontal gate material $G_h$ evaporated thereon, to provide the structure illustrated in FIG. 4F.

FIGS. 4G and 4H show widening of cavity H in the upper dielectric layer D2. H is widened at D2 to a radius R (cf. FIG. 1). FIG. 4G shows the structure obtained in FIG. 4F with a photoresist P2 having an opening of radius R, and FIG. 4H shows the structure after dielectric D2 is selectively dry etched with the photoresist protecting from etching the layers underneath it.

FIG. 4-I shows the structure obtained in FIG. 4H, after gate pillar G is oxidized to have an oxide layer D3. Oxide layer D3 is optionally created by controllably oxidizing with an oxygen plasma using an RIE device. Optionally, before the pillar is controllably oxidized, native oxides are removed from gate pillar G, for example, by dry etching. A lift off technique is preferably employed to remove photoresist P2 thereby obtaining the structure illustrated in FIG. 4J. Microscopic images of the device in the fabrication stage illustrated in FIG. 4J are shown in FIGS. 5A-D.

FIGS. 4K and 4L illustrate the deposition of an isolating layer I within cavity H, where in FIG. 4K shows a photoresist P3 is deposited on layer D2, prior to the deposition of layer I and FIG. 4L shows the structure after layer I is deposited within cavity H on then exposed region of C1. Layer I can be a SAM, (e.g., a protein-based SAM), a spin coated material, an inorganic nanocrystal, a polycrystalline crystal, a conjugated polymer, a Langmuir Blodgett film, and any combination thereof.

When layer I is SAM, it can be deposited using a layer exchange technique, e.g., as described in the article "Construction of dithiol-based nanostructures by a layer-exchange process" Meshulam et al. Small, 2005 volume 1, No. 9-9, p. 848-851, the contents of which is incorporated herein by reference. Layer I can serve as trench 12, as further detailed hereinabove (cf. FIGS. 3A-C).

FIG. 4M shows the structure obtained in FIG. 3L after deposition of a drain electrode C2. This deposition is optionally carried out with indirect evaporation of a drain electrode layer, for instance, palladium, on the structure. Alternatively, the drain electrode may be deposited using electroless plating. The drain electrode material which horizontally covers photoresist P3 during the evaporation or plating process is shown at $C2_h$. A lift off technique is preferably employed to remove photoresist P3 together with the drain electrode material C2$_n$ evaporated thereon, to provide the structure illustrated in FIG. 4N.

Optionally, the structure illustrated in FIG. 3B is obtained by defining the upper conductive layer with conventional photolithography, and selectively etching half of the upper contact. Alternatively, the structure illustrated in FIG. 3C is achieved by defining only half of the electrode, however, in this embodiment, care is preferable taken not to harm layer I.

FIGS. 5A-D are microscopic images of nanodevices in the fabrication stage schematically illustrated in FIG. 4-I. FIGS. 5A, 5B, and 5C are light microscope images with magnification of ×50, ×200 and ×50 respectively, and FIG. 5D is a TEM image with magnification of ×80,000.

In FIG. 5A two gold strips (Au) are shown on the backgrounds of photoresist P2, which has an opening at an area perpendicular to the gold strips. FIG. 5A shows the cavity (marked with an arrow) with titanium pillar covered with an oxide layer.

FIG. 5B shows the same structure in dark field. The titanium gate pillar G is shown inside the cavity H.

FIG. 5C shows only the gold strip with two pillars G1 and G2. A magnification of pillar G1 is provided in FIG. 5D, showing pillar G1 inside gold Au, which is surrounded by dielectric D2.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1

An array of nanometer-sized, ambipolar, vertical molecular transistors was fabricated in accordance with preferred embodiments of the present invention. The transistor is referred to in this example as Central-Gate Molecular Vertical Transistor (C-Gate MolVeT). The fabrication was by a combination of microlithography and self-assembly techniques To study an example of such array, the operation of an ultra-thin, 4 nm channel length C-Gate MolVeT, composed of Bovine Serum Albumin (BSA) protein was investigated. Each of the fabricated C-Gate MolVeT was approximately an order-of-magnitude smaller than existing commercial devices and showed remarkable ambipolar properties.

The architecture of the fabricated array was based on the concept of the vertical transistor, in which a side gate was used to activate a vertically-patterned semiconducting active-channel layer. The nanometer channel length was determined by a protein-based self-assembled monolayer, sandwiched between source and drain electrodes inside a microcavity. A centered oxidized-metal-electrode column inside the cavity served as the gate electrode.

The production procedure according to exemplary embodiments of the present invention is illustrated in FIGS. 6A-E.

Figure 6A:
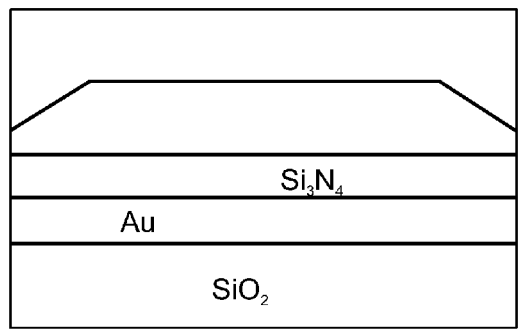
FIGS. 6A-E are schematic illustrations describing a production procedure used for fabricating an array of vertical transistors according to exemplary embodiments of the present invention.
Figure 6B:
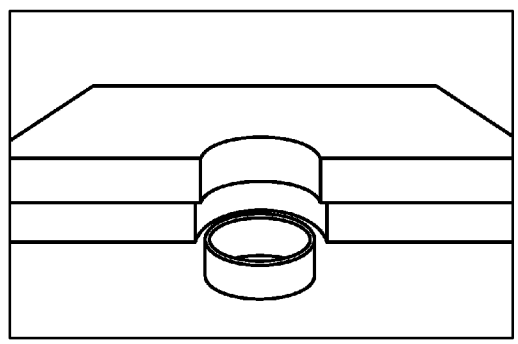
Figure 6C:
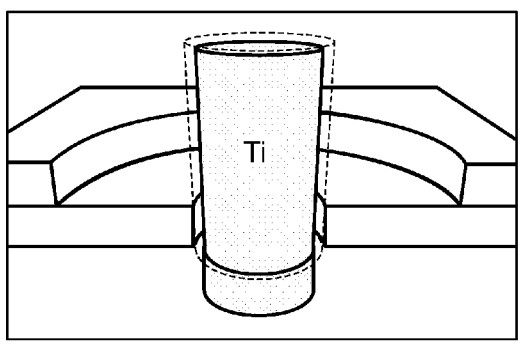
Figure 6D:
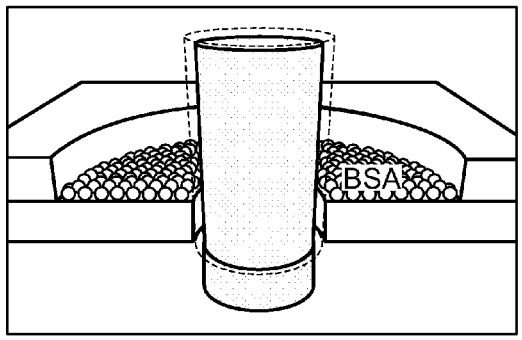
Figure 6E:
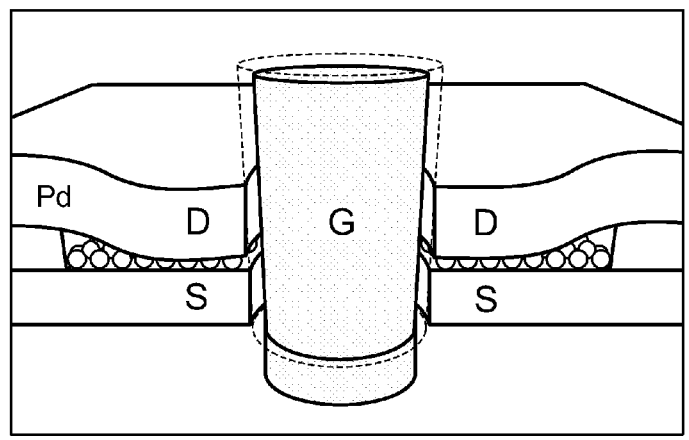

A network of gold electrodes was defined on top of a highly-doped silicon wafer covered with 100 nm thick thermal oxide, followed by the deposition of a 70 nm layer of Si$_3$N$_4$ dielectric (FIG. 6A). Subsequently, arrays of microcavities, ranging from 800 nm to 1.5 μm in diameter were created by drilling holes through the entire layer to the highly doped silicon substrate, followed by mild etching of several nanometers of the gold electrode. This undercut in the electrode provided space for oxide growth (FIG. 6B). Subsequently, a titanium column was evaporated, a larger cavity was defined, and the titanium column was oxidized to form the gate electrode (FIG. 6C). Subsequently, the protein-based SAM was adsorbed on top of the exposed gold ring and the upper electrode defined (FIG. 6D). Subsequently, the final C-Gate MolVet structure was achieved by an indirect evaporation of palladium on top of the protein layer (FIG. 6E).

Figure 6F:
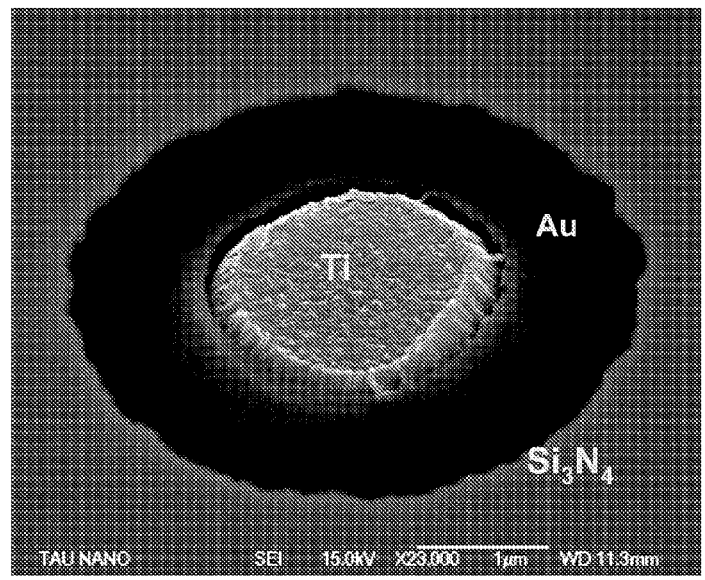

FIGS. 6F-G are tilted HRSEM images of a single transistor (FIG. 6F) and an array of transistors (FIG. 6E) before molecular assembly. FIG. 6H is an optical image of the transistor after the formation of the gate electrode, and FIG. 6-I is an HRSEM image featuring the fabricated array of the C-Gate MolVet transistors.

Note that, while the channel length was determined by the thickness of the active layer (in the present example about 4 nm), the sub-micrometer transistor area is defined by the difference between the macro-sized dimension of the cavity, and the area of the gate electrode. This area is approximately $\pi(R^2-(m+d)^2)$, where R and m+d are the photolithography-defined microcavity and the titanium-column radii, respectively.

According to various exemplary embodiments of the present invention, the lateral area of the transistor can be varied from several square microns down to sub-micrometer range. Furthermore, since R and m+d are micron-sized dimensions, the whole process can be performed in parallel, resulting in arrays composed of thousands of nanometer-sized molecular transistors.

The fabricated transistor was operated using a BSA-based SAM as the active-channel layer. BSA has 583 amino-acid residues and a molecular mass of 66.43 kDa and is a well studied proteins. (to this end see, e.g., Peters, T. J., "All About Albumin: Biochemistry, Genetics, and Medical Applications," Academic Press: San Diego, 1996). However, although high-purity ligand-free BSA is manufactured in vast amounts, its electronic properties are not well understood.

FIG. 7A shows an X-ray-crystallography-based structure of BSA. It is a prolate ellipsoid with major and minor axes of 14 and 4 nm, respectively. The Cys34 residue of BSA (highlighted in FIG. 7A) is responsible for the formation of the dense, self-aligned monolayer on the surface of the gold source electrode. In this monolayer, each individual protein assumes "side-on" or "end-on" arrangements, having minor or major axes oriented perpendicular to the surface. By controlling the pH and concentration of the BSA solution the present inventors obtained a closed packed, 4 nm height, SAM film. The film was evaluated by X-ray photoelectron spectroscopy and spectroscopic ellipsometry (see supplementary material)

FIGS. 7B-D show the transfer characteristics of the fabricated transistor, taken at room temperature, where FIG. 7B shows source-drain transport curves ($I_{SD}$-$V_{SD}$) taken for different gate voltages, FIG. 7C shows zooms of the negative $V_{SD}$ and of the positive $V_{SD}$, and FIG. 7D shows regions which demonstrate ambipolar characteristics.

Figure 8A:
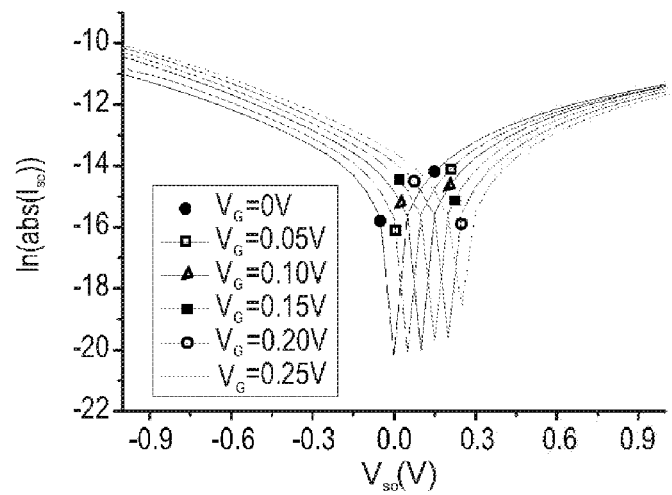
FIGS. 8A-C show sensitivity, leakage and amplification characteristics at room temperature of a transistor fabricated using the production procedure described in FIGS. 6A-E.
Figure 8B:
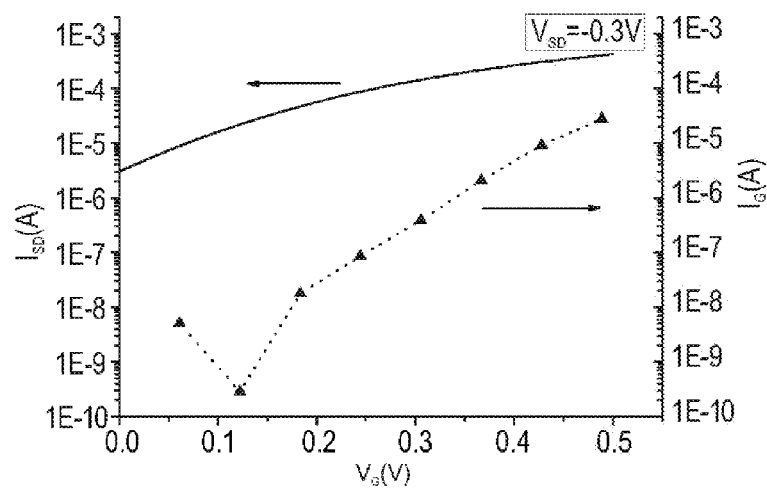
Figure 8C:
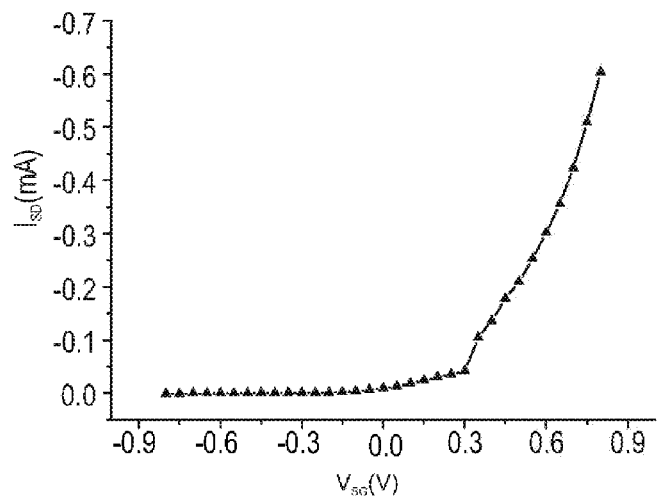

FIGS. 8A-C show sensitivity, leakage and amplification characteristics of the fabricated transistor, where FIG. 8A shows sensitivity characteristics of the transistor taken for different $V_G$, with 50 mV steps, FIG. 8B shows leakage-current characteristics of the fabricated transistor (triangle) compared to the source-drain currents (solid line) taken at $V_{SD}$=−0.3V, and FIG. 8C shows transfer characteristics of the fabricated transistor taken at $V_{SD}$=−0.4V.

Several unique features of the transistor of the present embodiments were deduced from the measured data.

(i) The source-drain transport curves ($I_{SD}$-$V_{SD}$) do not resemble those of conventional metal-oxide-semiconductor field-effect transistors (FIGS. 7B-D). Whereas in the standard MOSFET, saturation current is observed at a certain voltage, this is not the case in the transistor of the present embodiments.

(ii) $I_{SD}$ is extremely sensitive to the gate voltage, $V_G$. The present inventors have successfully measured $I_{SD}$ changes with $V_G$ intervals of 50 mV (see FIG. 8A) and 15 mV at 77K. This sensitivity is much better than previously reported for planar SAM-based transistors.

(iii) The operating voltages of the fabricated transistor do not exceed 1V (see FIG. FIGS. 8A-C. This voltage range is at least one order of magnitude smaller than that of conventional organic transistors, thus making the transistor of the present embodiments suitable for low-power-circuit applications.

(iv) Despite the narrow gate oxide (8 nm in the present example), the gate-source leakage currents are about three orders of magnitude lower than those of the drain-source currents (see FIG. 8B). For some $V_G$ values the leakage current even lower (four orders of magnitude below $I_{SD}$) under working $V_G$ conditions). For higher $V_G$ values the leakage current is two orders of magnitude below than $I_{SD}$. Similar leakage measurements performed between the drain and the gate terminals showed even lower currents. The leakage current can therefore be neglected in this transistor in the range of approximately $|V_G| \leq 0.45V$. At higher values of $V_G$, the transistor action resembles to a triode-type transistor. It is postulated that this property is due to the high dielectric constant of the titanium dioxide-gate material. The use of gate material with high dielectric constant is advantageous because it facilitate strong gate effect even for a relatively thin (8 nm) gate oxide.

(v) The shape of the transport data is asymmetric. This phenomenon can be attributed to the difference in the nature of the electrode contacts and their interface with the proteins. While strong chemical coupling between BSA and gold is achieved by a chemical bond, the coupling to the palladium electrode is weak since no chemical bond is created. As shown previously, this phenomenon can lead to strong asymmetry in the transport behavior.

(vi) The fabricated transistor shows ambipolar characteristics wherein both n- and p-type transistor properties can be measured on the same transistor by tuning the appropriate gate voltages (see FIG. 7D). In general, ambipolarity of transistors is desirable since it reduces the number of steps needed to fabricate complementary circuits. Furthermore, the low operating voltages of the ambipolar transistors compared to ambipolar organic FETs, make them far superior to conventional organic transistors.

(vii) The fabricated transistor shows amplification properties. The static amplification properties of the transistor are shown in FIG. 8C, demonstrating that the transistor shows moderate amplification with transconductance of 1-2 mS.

From the above observations, a general operational mechanism of the transistor can be deduced. At zero bias, the potential landscape is determined by the work functions of the metal electrodes, which inn this example are 5.1 eV for the gold source electrode, 5.12 eV for the palladium drain electrode and 3.84 eV for the titanium gate electrode. If the dielectric constant of the titanium oxide is taken into account, a Schottky barrier between the gate and the source/drain electrodes is formed and an inhomogeneous static electric field is penetrated into the monolayer. Thus, due to the ultra-small dimensions of the transitory of the present embodiments, a small variation in the gate voltages generates considerably changes in the electric-field distribution in the SAM layer, for both $V_{SD}$ polarities.

Figure 9A:
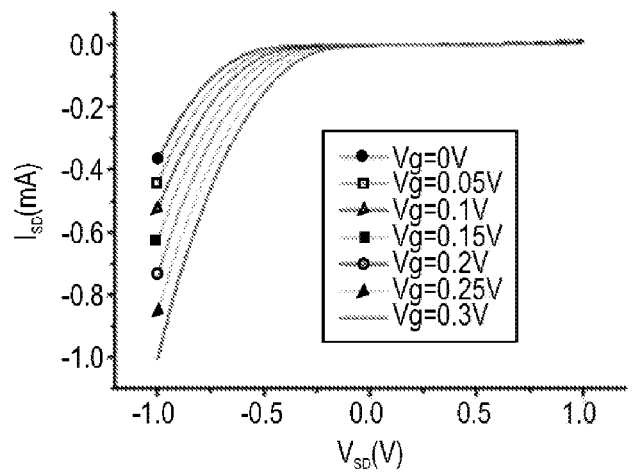
FIGS. 9A-C show characteristics at a temperature of 77K of a transistor fabricated using the production procedure described in FIGS. 6A-E.
Figure 9B:
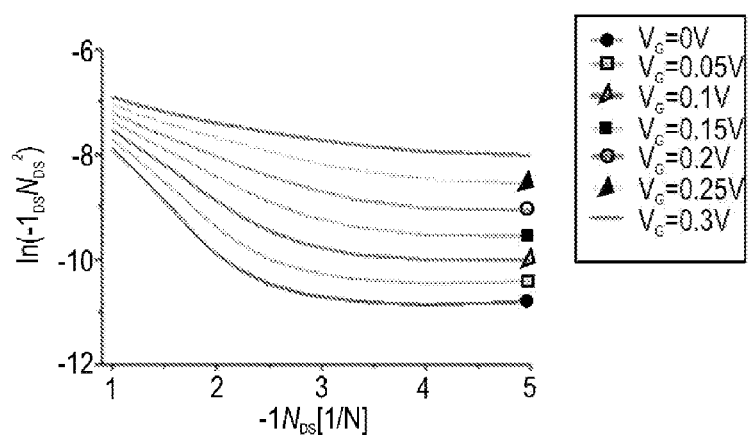
Figure 9C:
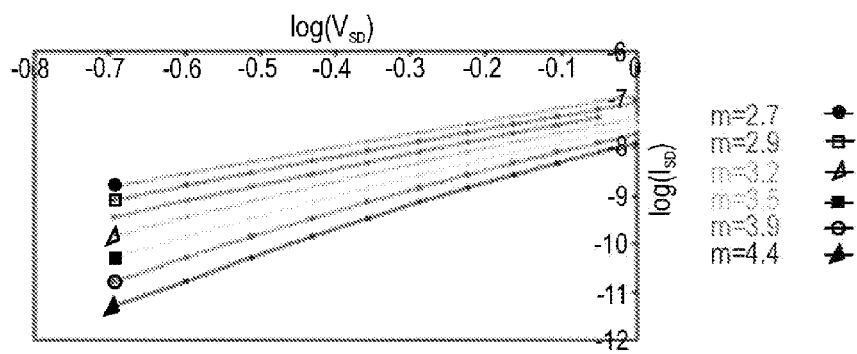

FIGS. 9A-C show the characteristics of the fabricated transistor at 77K, where FIG. 9A shows typical transistor action data, FIG. 9B shows Fowler-Nordheim plot of the negative drain voltage region, and FIG. 9C shows log-log plots (trap-charge-limiting) of the I-V curves shown in FIG. 9A, taken at the high-field region.

The data in FIGS. 9A-C can be explained by the two known dominant mechanisms for conventional organic vertical transistors: Fowler-Nordheim tunneling (FN) and trap-charge-limiting (TCL) behavior. In the case of FN, the current density, J, is related to the electric field, F, by $J \propto F^2 \exp(-k/F)$, where k is proportional to the effective mass of the protein and to the barrier height for carrier tunneling.

The linear correlation obtained at low electric fields (FIG. 9B) suggests that the FN mechanism dominates in this region. At a certain defined turning point, there is an apparent change in the transport mechanism, with FN no longer effective. In the case of organic triode transistors, this turning point is related to a critical electric field, in which the TCL mechanism starts to dominate.

In the TCL regime, transport is governed mainly by the electronic properties of the BSA moiety and less by the electrode properties. Thus, an increment in the bias increases the charge flux, thereby filling the limited number of traps. As a result, the overall currents increase the dependence of the voltage on current becomes power-like $I \propto V^m$. The log-log plots of the transistor for different values of $V_G$ (FIG. 9C) show that the slope is highly gate-dependent. The power order m ranges from about 2 to about 4. These results indicate the existence of unstable charges in the BSA medium and the gate effect on it.

Example 2

Figure 10:
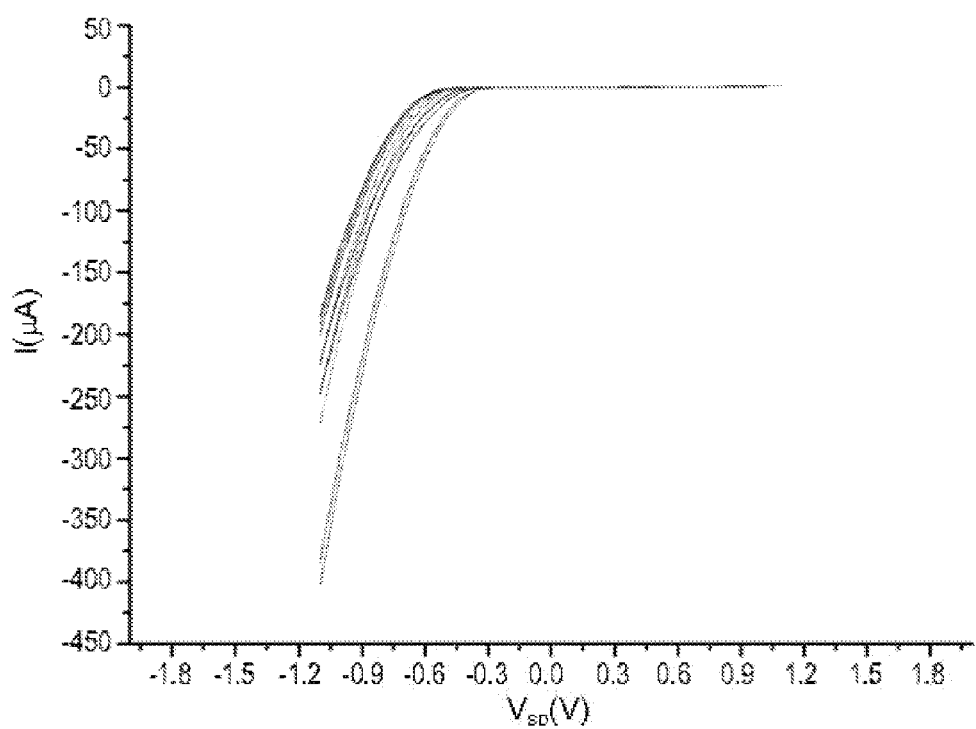
FIG. 10 is a graph showing electrical behavior of a transistor fabricated according to an embodiment of the invention.

FIG. 10 shows graphs of drain current as function of drain voltage obtained at different gate voltages with a vertical transistor fabricated in accordance with some embodiments of the invention. The difference in gate voltage between each two adjacent lines is 0.01V. The transistor was fabricated on a silicon/silicon oxide wafer, with gold and palladium as drain and source electrodes respectively and with titanium as the gate electrode. The titanium had a titanium oxide layer of about 5 nm thickness. The SAM was a 4 nm thick self assembled layer of BSA (Bovine Serum Albumin).

Example 3

Figure 11A:
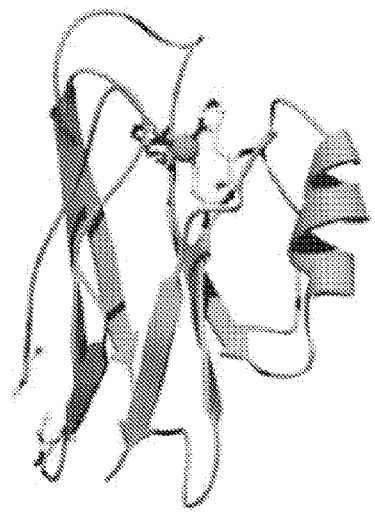
FIGS. 11A-11B are molecular models, of two substances, from which self assembled monolayers were prepared in two vertical transistors fabricated in accordance with embodiments of the invention.
Figure 11B:
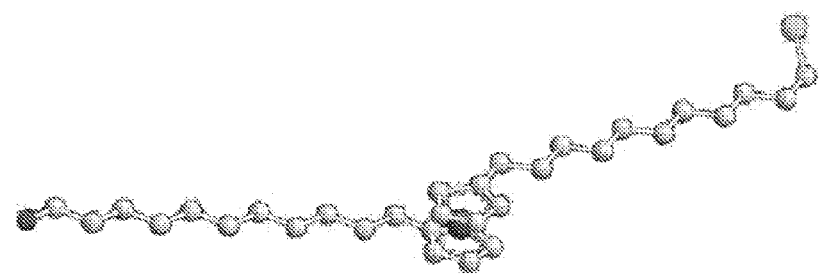

FIGS. 11A and 11B are molecular models, of two substances, from which self assembled monolayers were prepared in two vertical transistors fabricated in accordance with embodiments of the invention. FIG. 11A is a model of Azurin, and FIG. 11B is a model of a ferrocene molecule of the formula OH $Me_{11}C_5H_5FeC_5H_5Me_{11}SH$, where Me stands for $CH_2$.

Figure 12A:
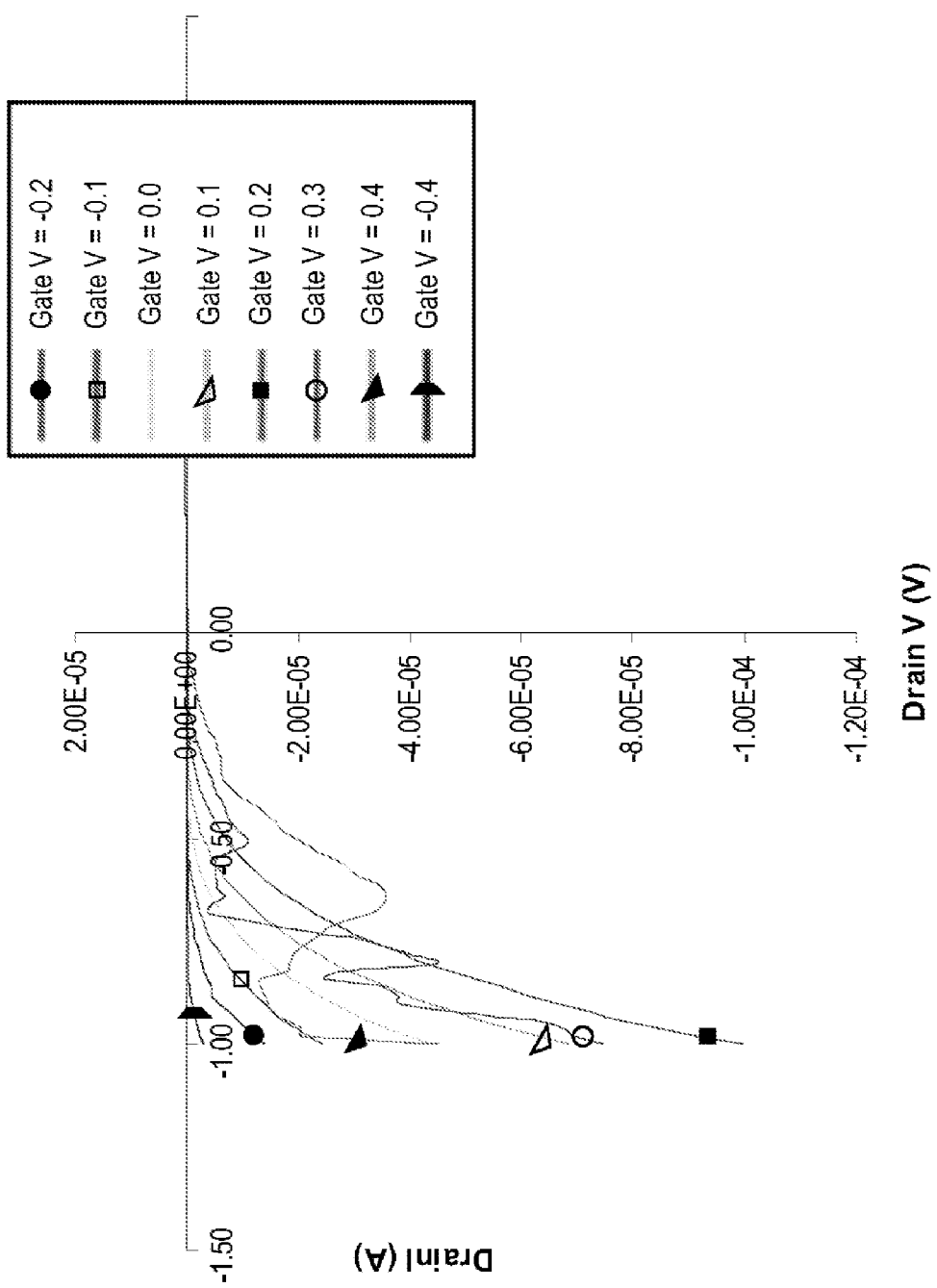
FIGS. 12A-B are graphs of drain current as a function of drain voltage obtained at different gate voltages with vertical transistors having a SAM of the molecules of FIGS. 11A and 11B respectively.
Figure 12B:
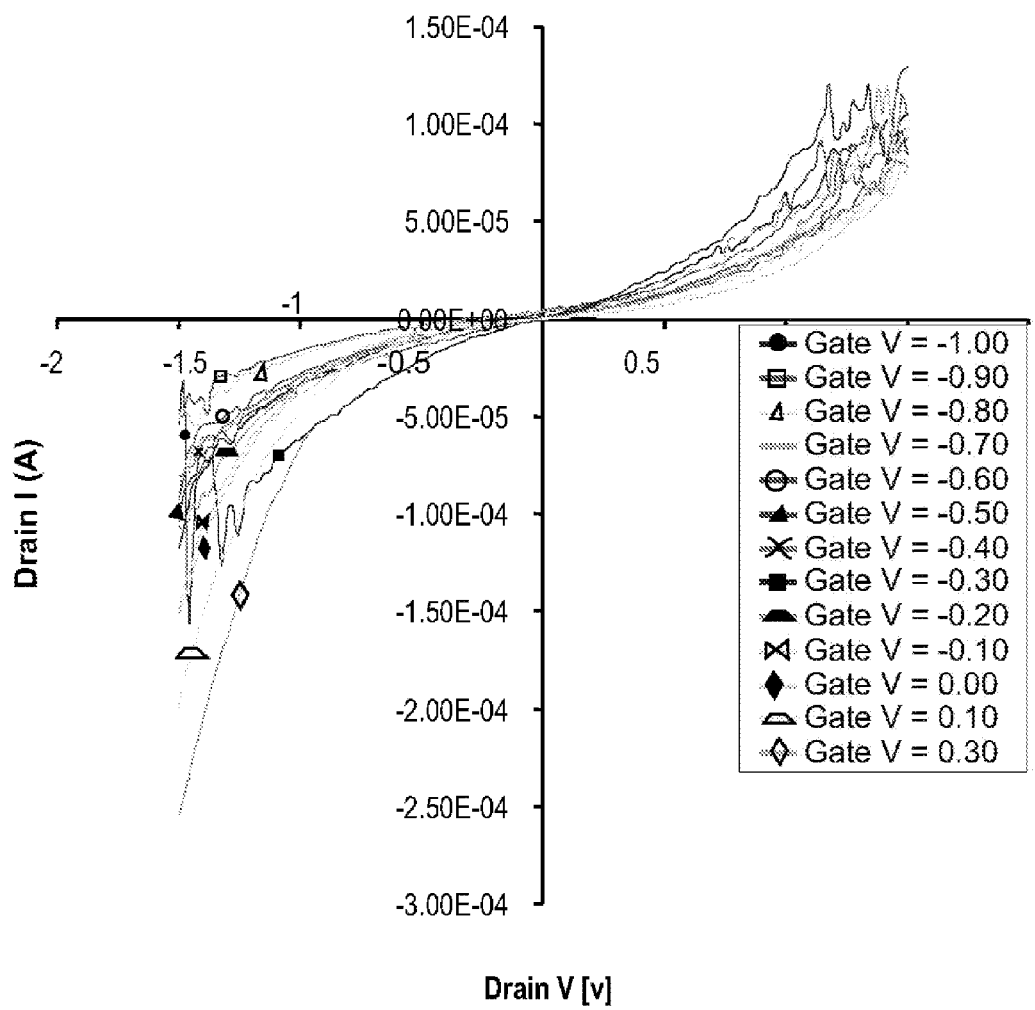

FIGS. 12A and 12B are graphs of drain current graphs of drain current vs. drain voltage obtained at different gate voltages with vertical transistors having a SAM of the molecules of FIGS. 11A and 11B respectively. In FIG. 12A, the difference in gate voltage between each two adjacent lines is 0.2V. The SAM thickness was 2 nm, and the thickness of the titanium oxide layer was 8 nm. In FIG. 12B the difference in gate voltage between each two adjacent lines is 0.1V. The SAM thickness was 2 nm, and the thickness of the titanium oxide layer was 8 nm.

It should be noted, that the transistors, the operation thereof is recorded in FIGS. 10, 12A, and 12B were considered impossible to obtain. For instance, Lee et al., Nano Letters 2003 Vol. 3 No. 2 pp 113-117, and Kagan et al., Nano Letters 2003 Vol. 3 No. 2 pp 119-124, predicted that gate-sensitivity may be achieved only when the SAM thickness is larger than 2.5-3 nm and the gate oxide layer is thinner than the SAM thickness divided by 1.5. In each of the transistors of FIGS. 10, 12A, and 12B the thickness of the oxide layer was larger than SAM thickness, and in the transistors of FIGS. 12A and 12B, the SAM thickness was less than 2.5 nm.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of fabricating a nanodevice, comprising:
   forming a cavity in a layered structure having a first conductor layer interposed between a base substrate and a dielectric layer, such that said cavity extends over at least said conductor layer and said dielectric layer;
   depositing a metallic pillar into said cavity;
   exposing a region of said conductor layer near said pillar thereby widening said cavity at said dielectric layer;
   depositing a channel layer in said exposed region; and
   depositing a second conductor layer on said channel layer.

2. The method according to claim 1, further comprising partially widening said cavity at said first conductor layer, prior to said depositing of said pillar.

3. The method according to claim 1, further comprising oxidizing said pillar prior to said exposure of said region of said conductor layer.

4. The method according to claim 1, wherein said cavity is formed to extend from said base substrate through said first conductor layer to said dielectric layer, such that when said pillar is deposited, electrical contact is establish between said pillar and said base substrate, thereby allowing back gating of the nanodevice via said base substrate.

5. A method according to claim 1, being executed for forming a vertical transistor, wherein said first conductor layer is a source electrode of said transistor, said second conductor layer is a drain electrode of said transistor, and said pillar is a gate electrode of said transistor.

6. A method comprising:
   forming a cavity in a layered structure having a first conductor layer interposed between a base substrate and a dielectric layer, such that said cavity extends over at least said conductor layer and said dielectric layer;
   partially widening said cavity at said first conductor layer to form a niche therein;
   depositing a metallic pillar into said cavity without filling the niche;
   exposing a region of said conductor layer near said pillar thereby widening said cavity at said dielectric layer; and
   oxidizing said pillar.

7. A method according to claim 2, wherein said partially widening said cavity comprises widening in no more than 10 nm.

8. A method of fabricating a nanodevice comprising:
forming a cavity in a layered structure having a first conductor layer interposed between a base substrate and a dielectric layer, such that said cavity extends over at least said conductor layer and said dielectric layer;
growing a nanostructure in said cavity;
exposing a region of said conductor layer near said pillar thereby widening said cavity at said dielectric layer; and
oxidizing said nanostructure.

9. A method according to claim 8, wherein the nano-structure is a nanotube.

10. A method according to claim 8, wherein the nanostructure is a nanowire.

11. A method according to claim 8, further comprising widening said cavity at said dielectric layer, and depositing a channel layer a region formed by said widening.

12. The method according to claim 8, wherein said cavity is formed to extend from said base substrate through said first conductor layer to said dielectric layer, such that when said nanostructure is grown, electrical contact is establish between said nanostructure and said base substrate, thereby allowing back gating of the nanodevice via said base substrate.

13. A method according to claim 11, being executed for forming a vertical transistor, wherein said first conductor layer is a source electrode of said transistor, said second conductor layer is a drain electrode of said transistor, and said nanostructure is a gate electrode of said transistor.

* * * * *